US012696552B2

(12) United States Patent
Gola et al.

(10) Patent No.: US 12,696,552 B2
(45) Date of Patent: Jul. 28, 2026

(54) DIODE RADIATION SENSOR

(71) Applicant: Fondazione Bruno Kessler, Povo (IT)

(72) Inventors: Alberto Gola, Trento (IT); Fabio Acerbi, Trento (IT); Giacomo Borghi, Trento (IT); Gianluigi Casse, Trento (IT); Alberto Mazzi, Trento (IT); Giovanni Paternoster, Trento (IT)

( * ) Notice: Subject to any disclaimer, the term of this patent is extended or adjusted under 35 U.S.C. 154(b) by 371 days.

(21) Appl. No.: 18/554,788

(22) PCT Filed: Apr. 12, 2022

(86) PCT No.: PCT/IB2022/053408
§ 371 (c)(1),
(2) Date: Oct. 11, 2023

(87) PCT Pub. No.: WO2022/219516
PCT Pub. Date: Oct. 20, 2022

(65) Prior Publication Data
US 2025/0089383 A1 Mar. 13, 2025

(30) Foreign Application Priority Data
Apr. 14, 2021 (IT) ........................ 102021000009446

(51) Int. Cl.
*H10F 30/225* (2025.01)
*H10F 77/00* (2025.01)

(52) U.S. Cl.
CPC ......... *H10F 30/225* (2025.01); *H10F 77/959* (2025.01)

(58) Field of Classification Search
CPC .... H10F 30/225; H10F 30/2255; H10F 55/15; H10F 55/155; H10F 55/20; H10F 55/255; H10F 77/00; H10F 77/959
See application file for complete search history.

(56) References Cited

U.S. PATENT DOCUMENTS

2016/0351604 A1* 12/2016 Kalnitsky ............. H10F 39/811
2017/0098730 A1* 4/2017 Mazzillo ................ H10F 71/00
2019/0103504 A1* 4/2019 Yamashita ............ H10F 77/959

FOREIGN PATENT DOCUMENTS

EP          3151290     4/2017
EP          3435422     1/2019
WO     2020059702      3/2020
WO     2021059687      4/2021

* cited by examiner

*Primary Examiner* — Brook Kebede
(74) *Attorney, Agent, or Firm* — Themis Law

(57) ABSTRACT
A diode radiation sensor having charge multiplication diodes and comprising a substrate with a front and a rear surface; a first layer of a semiconductor material doped with a first type of doping and arranged on the front surface of the substrate; a second layer of a semiconductor material doped with a second type of doping of electrically opposite sign to the first type and arranged to create a high electric field region between the first and the second layer; a third layer of a semiconductor material doped with a the second type of doping; a first isolation region interposed between a lateral edge of a charge multiplication diode and the first and the second layer of the semiconductor materials and extending into the substrate from the front surface to the third layer so as to create a working area electrically separated from the first and the second layer.

9 Claims, 2 Drawing Sheets

DIODE RADIATION SENSOR

FIELD OF APPLICATION

The present invention can be applied to the field of radiation sensors and, in particular, to the field of diode radiation sensors.

More in detail, the present invention relates to a sensor having one or more charge multiplication diodes.

BACKGROUND ART

Radiation sensors include single photon avalanche diodes (SPAD). A single SPAD consists of a charge multiplication diode which is polarized to work in geiger mode. A sensor can consist of a single SPAD or a set of SPADs, also called microcells or pixels. The sensors consisting of multiple SPADs include silicon photomultiplier sensors, also called SiPMs, which typically consist of SPADs connected in parallel.

Typically, as shown in FIG. 1, a microcell M is made in a substrate S of semiconductor material, typically epitaxial. In such a substrate S, a first layer P1 of doped semiconductor material is identified to be a first type of conductor (which can indifferently be of type n or type p, however of opposite sign to the doping of the substrate S). Such a first layer P1 is made on the front surface of the substrate S.

Then there is a second layer P2 of doped semiconductor material of opposite sign to the first layer P1 and made in depth in the substrate S. The latter is generally doped with the same sign as P2, but in smaller amounts. Then there is typically a doped bottom layer PF of the same sign as P2. The diode supply typically, but not necessarily, is between the first layer P1 and the bottom layer PF and, in accordance with the supply, between the first P1 and the second layer P2 or between the first P1 and the bottom layer PF an emptying region is created. In any case, between the first layer P1 and the second layer P2, in the presence of an appropriate polarization, a region with a high electric field E is created for generating the multiplier effect of the diode charge.

For each SPAD, at least one of the two poles or two electrical contacts must be functionally isolated from its neighbours in order to correctly operate as envisaged. For such a reason, a typically electrical and possibly also optical isolation region R is usually made therebetween. In fact, the optical isolation between adjacent cells is desirable, although not mandatory, for reducing related noise in terms of optical crosstalk.

However, this means that part of the volume of the device is dedicated to the isolation region R.

Furthermore, the second layer P2 must be spaced from such a region R in order to substantially obtain a guard ring which can be of the virtual guard ring type (VGR), i.e., in order to prevent excessively high electric fields at the edges of the active area.

Accordingly, in a SiPM, the sensitive area of each SPAD is significantly smaller than its total area due to the isolation region R and the guard ring VGR, forming the so-called dead edge of the cell. By defining the fill factor of the cell as the ratio of the sensitive area to the total area of a microcell, it is evident that the higher this number, the more efficient the single cell. Moreover, it is evident that the smaller the microcell, the more harmful a raised dead edge.

For what has been said thus far, therefore, the fill factor of a microcell is affected firstly by the space lost for the creation of the isolation region and secondly by the necessary spacing forming the virtual guard ring.

In other words, according to the known art, the size of the dead edge of each microcell is determined both by the design rules (the minimum distances above) and by the additional effect of charge collection paths which do not pass through the high electric field area. This introduces sensitivity losses of the radiation sensor. Also according to the known art, therefore, the larger the dead edge, the greater the negative effects just mentioned.

PRESENTATION OF THE INVENTION

An object of the present invention is to at least partially overcome the drawbacks mentioned above.

First of all, it should be noted that as a result of the foregoing, and unlike what is normally considered in the prior art, it is therefore possible to argue that the main problem of an SPAD is not so much the extent of the sensitive area or the extent of the charge collection region, but the ability to collect as many charges as possible from the collection region and bring them as far as possible into the sensitive area.

The result is a possible reversal of the paradigm according to which it is essential, for the sensitive area, to expand the high electric field area in which the avalanche effect of the diode develops as much as possible.

Therefore, for what has just been said, the main object of the present invention to at least partially overcome the above-mentioned drawbacks remains unchanged, providing a radiation sensor having improved performance in terms of fill factor with respect to the known equivalent sensors with regard to the ability of incident radiation to trigger an avalanche in the charge multiplication diode without significantly (or excessively) increasing the dark count rate.

However, such a general object is expressed, in particular, in a first detailed object of providing a radiation sensor in which the greatest number, if not all, of the charges generated in the collection area by the radiation incidence are conveyed to the charge multiplication area (i.e., the high electric field region). All this, as a further object of the present invention, regardless of the actual extent of the high electric field region.

Another object of the present invention is to provide a radiation sensor in which the isolation regions have a lower incidence on the substrate by decreasing, if not substantially cancelling, their contribution to the generation of the so-called dead edge, i.e., limiting the number of charges generated by the radiation incidence and flowing towards the high electric field region.

Such objects, as well as others which will become clearer below, are achieved by a diode radiation sensor in accordance with the following claims, which are to be considered as an integral part of the present disclosure.

In particular, it consists of one or more charge multiplication diodes (of the charge obtained through the impact ionization mechanism for which they are also said avalanche diodes) which typically, but not necessarily, will be polarized to work in geiger mode. In such a sense, the sensor comprises a substrate made of semiconductor material and having two surfaces, a front surface and a rear surface opposite the front surface.

At least near the front surface there is at least a first layer of semiconductor material doped with a doping of a first type, whether of type n or of type p. Such a first layer is made so as to cover at least a first central area of the front surface of the substrate.

There is also at least a second layer of semiconductor material doped with a doping of a second type of electrically opposite sign to the first type. Such a second layer is made at a first depth in the substrate and develops substantially parallel to the first layer so as to affect a second area which identifies between the two layers, when the sensor is appropriately polarized, a high electric field region. In other words, the two layers create the charge multiplication region of an avalanche diode whose working area, and thus whose charge multiplication level and the corresponding geiger or non-geiger working mode will be determined by the power supply of the same diode.

According to an aspect of the invention, the radiation sensor also comprises at least a third layer of semiconductor material doped with a doping of the second type and made at a second depth in the substrate which is greater than the first depth. In particular, the third layer affects a third area which, in plan projection, is at least partially lateral to the second area.

In other words, the third layer substantially forms a frame for the high electric field region. In this sense, advantageously, it prevents the charges generated in the substrate from heading towards the virtual guard ring, focusing them towards the high electric field region. In other words, it performs a substantially funnel function for the charges generated in the substrate which are thus directed towards the high electric field region. Advantageously, this is the case regardless of the extension of such a region.

With the execution just described, a relevant part of the voltage drop of the sensor is typically located between the first and second layer because it is the region with the highest electric field. Approximately, the same voltage drop is also identified between the first and third layer since the latter is typically at the same potential as the second layer. To avoid the multiplication of avalanches above the third layer, it is important that the voltage drop between the latter and the first layer is generated on a significantly longer path than that between the first and second layer. The execution of the third layer deeper than the second layer allows, advantageously, to increase the aforesaid path, limiting, if not cancelling, additional charge multiplications.

As previously mentioned, the presence of the third layer of semiconductor material makes the surface extension of the first and second layer of semiconductor material, i.e., the high electric field region, not very influential for the purpose of collecting and multiplying the charge generated in the diode. By virtue of such an expedient, according to a further aspect of the invention, the radiation sensor of the invention further comprises at least a first isolation region interposed between the lateral edge of the radiation sensor and the first and second layers of semiconductor material. Such a first isolation region extends deep in the substrate from the front surface to the third layer of semiconductor material so as to create, between the lateral edge of the radiation sensor and the first isolation region in a first direction and between the front surface and the third layer in a second direction orthogonal to the aforesaid first direction, a working area electrically separated from the first and second layers of semiconductor material.

The presence of the third layer which focuses the charges towards the high electric field region thus advantageously allows to obtain, within the region which goes from the front surface of the substrate to the third layer of semiconductor material, a space large enough to contain a small high field region, an effective virtual guard ring and some additional structures which can be positioned in the aforementioned working area. All this essentially without worsening the fill factor.

According to another aspect of the invention, the optical sensor comprises at least a second isolation region made peripherally to the substrate.

It follows that there is an electrical, and typically also optical, isolation between the charge multiplication diodes forming the sensor. However, advantageously, it is observed that the second isolation region could be limited to isolating only the substrate of adjacent cells where the collection of charges occurs, i.e., be extended, vertically, in a volume comprised between the rear surface and the second layer.

Moreover, still advantageously, such a second isolation region, which in fact forms a trench, may not affect both surfaces. This is particularly advantageous as the surface intended to receive the radiation can be preserved continuously and unimpaired and thus there are no elements which can influence the correct radiation incidence.

According to another aspect of the invention, the radiation sensor further comprises at least a fourth layer of semiconductor material doped with a doping of the first type and made at least near the front surface of the substrate above the first layer. Furthermore, the doping of the fourth layer is greater than that of the first layer so as to obtain a conductivity of the fourth layer greater than the conductivity of the first layer.

Advantageously, the layer consisting of the first and fourth layers is patterned, i.e., it has a doping graduality which allows, advantageously, to shape the electric fields which involve it especially at the edges with this, moreover, increasing the isolating effect of the virtual guard ring. Potentially, therefore, such a virtual guard ring could be reduced in extension.

Moreover, still advantageously, the use of different doping species can be used in the two layers in order to further model the doping gradient in the set of the first and fourth layer.

BRIEF DESCRIPTION OF THE DRAWINGS

Further features and advantages of the invention will become more evident in light of the detailed description of a preferred but non-exclusive embodiment of an optical sensor according to the invention, illustrated by way of non-limiting example with the aid of the accompanying drawings, in which.

DETAILED DESCRIPTION OF AN EXEMPLARY PREFERRED EMBODIMENT

Figure 1:
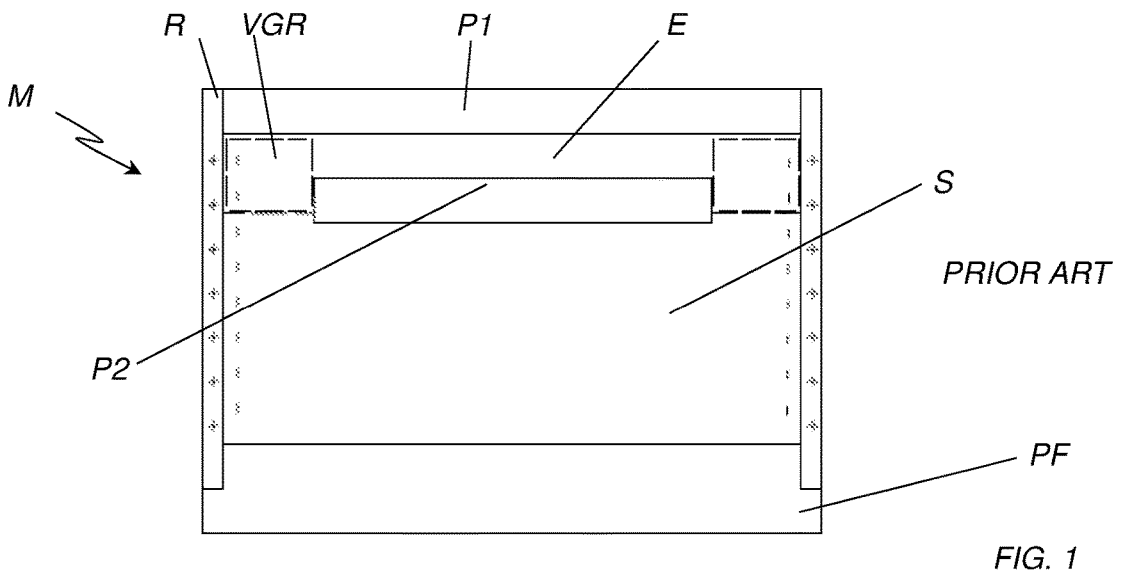
FIG. 1 depicts a radiation sensor according to the state of the art in schematic view.
Figure 2:
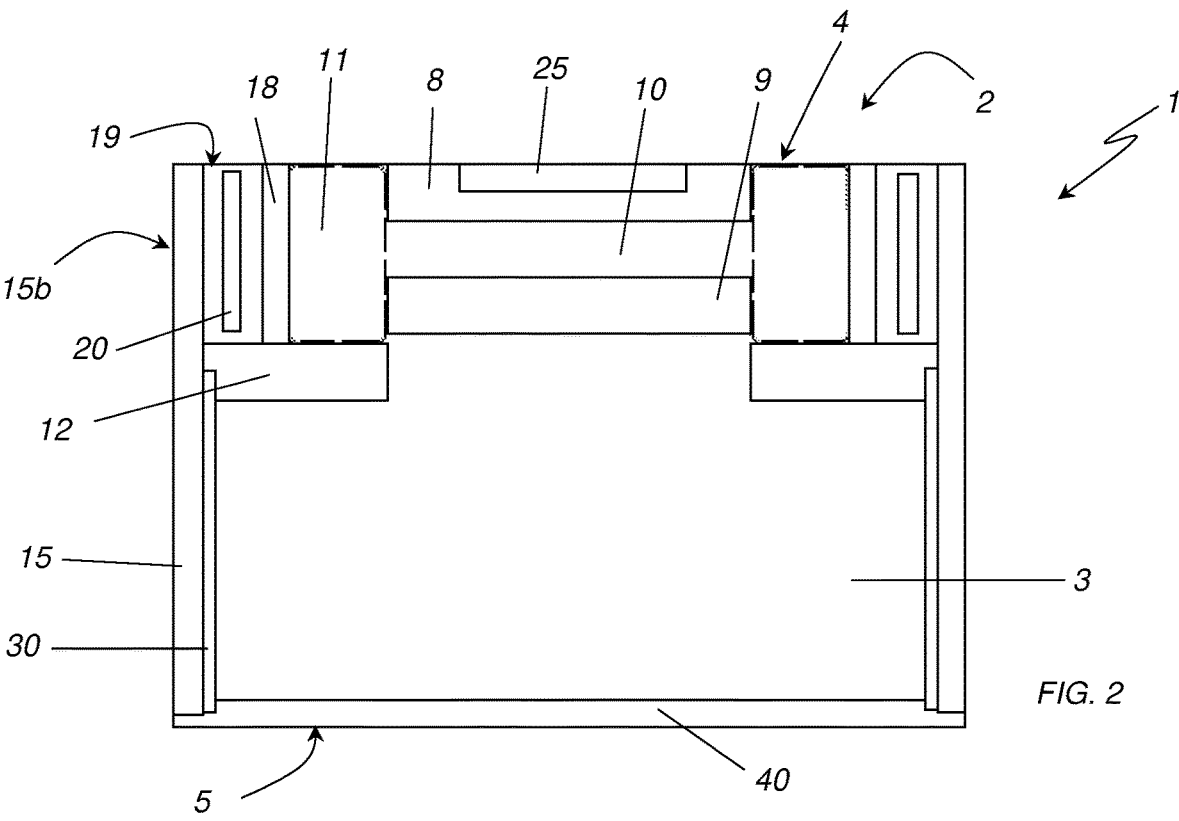
FIG. 2 depicts a radiation sensor according to the invention in schematic view.

With reference to the cited figures, and in particular to FIG. 2, a radiation sensor 1 is described having one or more charge multiplication diodes 2 which will typically, but not necessarily, be polarized so as to work in geiger mode. For ease of description, the sensor 1 depicted in the figures comprises a single diode 2, but it is evident that such an aspect must not be considered limiting for the present invention.

More in detail, the charge multiplication diodes 2 are typically of the avalanche type due to the impact ionization mechanism.

Therefore, the sensor 1 comprises a substrate 3 made of semiconductor material and having two surfaces, a front surface 4 and a rear surface 5 opposite the front surface 4.

On the front surface 4 there is a first layer 8 of semiconductor material doped with a first type of doping. In the figures, such a doping is of type n, but also this aspect must not be considered limiting for the present invention. In fact, the reversal of the types of doping cited in the present description does not make any difference for the purposes of the present patent.

The thickness of the first layer 8 can also be any in accordance with the design parameters of the sensor 1. In general, it is specified that regardless of what can be deduced from the figures, the thicknesses of all the layers indicated in the present patent will be in accordance with the design parameters of the radiation sensor without any limitations for the invention.

The position of the first layer 8 on the front surface of the substrate 3 is also a feature to be considered non-limiting for the invention, since there are embodiment variants not depicted here where the same first layer is made deep in the substrate (although near the front surface) and connected with the front surface by an electrical contact.

The first layer 8 is made to cover a first central area of the front surface 4 of the substrate.

There is also a second layer 9 of semiconductor material doped with a doping of a second type of electrically opposite sign to the first type. In such a sense, the doping is of type p, but as mentioned, this aspect must not be considered limiting for the present invention, the inversion of the types of doping does not involve any difference for the purposes of the present patent.

The second layer 9 is made at a first depth in the substrate 3 and extends substantially parallel to the first layer 8 so as to affect a second area. Furthermore, a high electric field region 10 for generating the charge multiplication effect is identified between the second layer 9 and the first layer 8 when the sensor 1 is appropriately polarized.

Typically, also the substrate 3 is doped with a doping of the second type, but with a lower doping level than that of the second layer 9. Similarly typically, on the rear surface 5 of the substrate there is a further doped layer 40 with the second type of doping, generally at higher doping with respect to that of the substrate. Although it is observed in the figure that such a further doped layer 40 covers the entire rear surface 5, such an aspect must not be considered limiting for different embodiments of the invention where the further doped layer covers only a portion of the rear surface of the substrate.

Peripherally to the first 8 and the second layer 9 there is a separation space from the edge of the cell which performs a similar function, substantially, a virtual guard ring 11, i.e., it has the function of preventing high electric fields at the edges of the active area.

According to an aspect of the invention, the radiation sensor 1 also comprises a third layer 12 of semiconductor material doped with a doping of the second type (therefore typically, but not necessarily, coinciding with the doping of the second layer 9) and made at a second depth in the substrate 3 greater than the first depth, i.e., it is at a greater depth in the substrate 3 with respect to the depth of the second layer 9. In the figures it is noted that the second layer 9 and the third layer 12 are separated, but such a detail must not be considered limiting for the invention. Furthermore, the third layer 12 affects a third area which, in plan projection, is at least partially lateral to the second area.

In other words, as also mentioned above, the third layer 12 substantially forms a frame for the high electric field region 10 and is positioned between it and the substrate 3. In this sense, advantageously, it prevents the charges generated by the effect of the incident radiation in the substrate 3 from heading towards the virtual guard ring 11 by focusing them towards the high electric field region 10. Previously, a substantial funnel effect was mentioned since it coarsely, but effectively, exemplifies the function of conveying the charges generated in the substrate 3 by the incidence of the radiation towards the high electric field region 10 where the charge multiplication effect is obtained.

Advantageously, due to such conveying, which is similar to an efficient focusing mechanism of the charges, the size of at least the second semiconductor material layer 9 and the high electric field layer 10, if not also of the first layer 8, can be reduced, obtaining the following advantages:

there is potentially more space for the virtual guard ring 11. This is important in general, but is fundamental for the small size of the cells, in which the minimum size required for the virtual guard ring 11 to be effective would otherwise use the entire width of the cell, without leaving room for the first layer 8 and the second layer 9;

reduced capacity of the diode 2, which allows to construct microcells with faster charging times, in particular in the case of the passive charge multiplication quenching mechanism, obtained through the so-called "quenching resistance", which is normally used in analogue SiPMs;

a lower cathode capacity also corresponds to a lower gain deriving from the charge multiplication effect, defined as the average number of charges passing through the high electric field layer 10 for each detected photon. An overall lower gain allows less related noise.

However, the focusing effect carried out by the third layer of semiconductor material 12 also allows the use of further constructive expedients.

According to another aspect of the invention, the radiation sensor 1 of the invention further comprises a first isolation region 18 interposed between the edge 15b of the sensor 1 and the first 8 and the second layer of semiconductor material 9. Such a first isolation region 18 extends deep in the substrate 3 from the front surface 4 to the third layer of semiconductor material 12 so as to create, between the edge 15b of the sensor 1 and the first isolation region 18 in a first direction and between the front surface 4 and the third layer 12 in a second direction orthogonal to the aforesaid first direction, a working area 19. It is electrically separated from the charge multiplication diode 2.

In other words, the presence of the third layer 12 which focuses the charges towards the high electric field layer 10 thus advantageously allows to obtain, within the area which goes from the front surface 4 of the substrate 3 up to the third layer of semiconductor material 12, a space large enough to contain both a high electric field region 10, more than sufficient to obtain the desired effects, an effective virtual guard ring 11 and some additional structures which can be positioned in the working area 19.

According to another aspect of the invention, the optical sensor 1 comprises a second isolation region 15 made peripherally to the substrate 3 and extending deep in the same substrate 3 starting from the front surface 4. In particular, it is observed in the figure that such a second isolation region 15 is arranged laterally to the first 8, the second 9, the third layer 12 and reaches the rear surface 5 of the substrate, but such an aspect must not be considered limiting for different embodiments of the invention according to which the second isolation region descends deep in the substrate up to an intermediate position between the third layer and the rear surface of the substrate or even ends at the beginning of the third layer. According to further embodiment variants, not depicted here, the second isolation region is arranged laterally only to the substrate from the third layer of semiconductor material to the rear surface of the radiation sensor.

Typically, the isolation region 15 is made by etching the substrate 3 and inserting in the groove thus obtained one or more materials of which typically, but not necessarily, an isolator (typically oxide of the semiconductor material of which the substrate 3 itself is formed), but also this aspect must not be considered limiting for the present invention. Typically, but not necessarily, the semiconductor material is silicon and the oxide is thus silicon.

The function of the second isolation region 15 is of functional isolation between the diodes 2 forming the sensor 1 or portions thereof.

In the embodiment depicted in FIG. 2, additional optical isolating structures 20 are inserted in the work areas 19 in order to improve the optical isolation between the cells, thus reducing the likelihood of optical crosstalk.

However, such a detail must not be considered limiting for different embodiments of the invention where the working areas find different uses.

Figure 3:
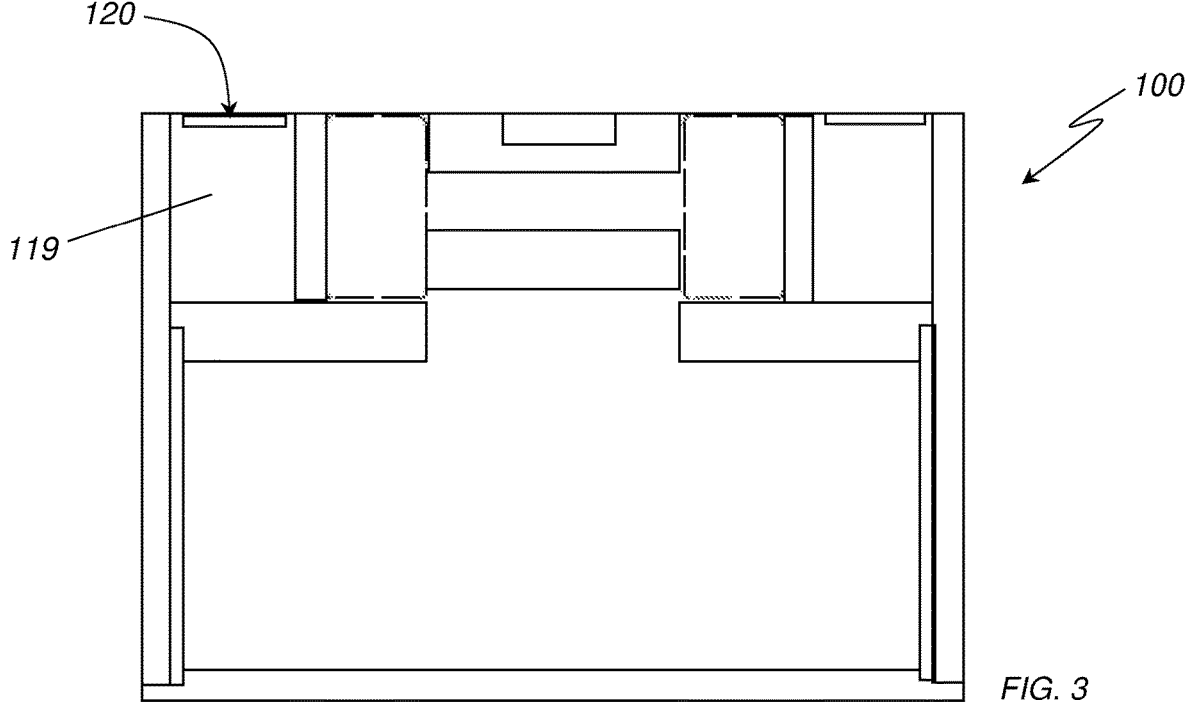
FIG. 3 depicts an embodiment variant of the radiation sensor of FIG. 2.

According to a particular alternative embodiment of a sensor 100, depicted in FIG. 3, electronic circuits 120 (e.g., CMOS circuits) are inserted in the working areas 119 which can have various uses including, for example, the active charging of the microcell or the reading thereof.

Returning to FIG. 2, it is observed that the first layer 8 of semiconductor material is not unique. In fact, there is a fourth layer 25 of semiconductor material doped with a doping always of the first type and made on the front surface 4 of the substrate 3 above the first layer 8. In particular, the doping of the fourth layer 25 is greater than the doping of the first layer 8. Thereby, substantially, the first layer 8 is patterned, i.e., it has a doping graduality which allows, advantageously, to model the electric fields which involve it especially at the edges. Moreover, different doping species can be used in the fourth layer 20 and in the first layer 8 in order to further model the doping gradient. In any case, this increases the effectiveness of the virtual guard ring 11. Potentially, therefore, such a virtual guard ring 11 could be reduced in extension.

Also in this case, the position of the fourth layer 25 on the front surface of the substrate 3 is a feature to be considered non-limiting for the invention, since there are embodiment variants not depicted here where the same fourth layer is made deep in the substrate (although near the front surface and in any case at least partially interposed between the front surface and the first layer) and connected with the front surface by an electrical contact. In other embodiments variants, however, the same fourth layer is shaped and comprises the aforesaid electrical contact.

According to another aspect of the invention, the radiation sensor 1 also comprises a sixth layer 30 of semiconductor material doped with a doping of the second type arranged deep in the substrate starting from the third layer 12 and interposed between the substrate 3 and the second isolation region 15.

Also such an aspect must not be considered limiting for the present invention, the sixth layer being, according to some embodiment variants, not doped but naturally induced by the second isolation region and by what forms it together with the doping type of the substrate. More generally, and without any limits for the present invention, the sixth layer is a layer of semiconductor material, however obtained, which is not emptied because it contains a sufficiently high concentration of majority carriers, during the normal operation of the device, of the same type as those present in the substrate in which the sixth layer is identified.

Advantageously, in any case, the surface of the second isolation region 15 in contact with the substrate 3 is not emptied, improving the collection of charges in the substrate 3 and reducing the injection of charges generated on the surface of the second isolation region 15, i.e., reducing the noise of the device understood as dark current.

Still advantageously, since the third 12 and sixth layer 30 have mobile charges of the same type, their electrical contact allows, if deemed appropriate and if the sixth layer 30 has an external electrical contact, to power them together. Therefore, such a single power supply will increase the ability to focus the charges generated by the photons incident on the substrate 3 towards the high electric field region 10.

In light of the foregoing, it is understood that the radiation sensor of the invention achieves all the preset objects.

In particular, the radiation sensor of the invention undoubtedly achieves improved performance with respect to the equivalent sensors with regard to the ability of the incident radiation to generate charges and the ability of the sensor to focus such charges towards the active area of the sensor itself.

However, such a general object is achieved by the fact that in the sensor of the invention the greatest number, if not the totality, of charges generated in the collection area by the incidence of the photons is conveyed to the sensitive area (i.e., the high electric field region), as well as by the fact that this occurs regardless of the actual extension of the high electric field region.

On closer inspection, the isolation regions have a lower incidence on the substrate decreasing, if not substantially cancelling, their contribution to the generation of the so-called dead edge, i.e., to the limitation of the number of charges generated by the incidence of photons flowing towards the high electric field region.

The invention might be subject to many changes and variants, which are all included in the appended claims. Moreover, all the details may furthermore be replaced by other technically equivalent elements, and the materials may be different depending on the needs, without departing from the protection scope of the invention defined by the appended claims.

The invention claimed is:

1. A diode radiation sensor at least one charge multiplication diode, said diode radiation sensor comprising:
   a substrate made of a semiconductor material, having a front surface and a rear surface opposite said front surface;
   a first layer of semiconductor material doped with a doping of a first type and made at least adjacently said front surface of said substrate, wherein the first type comprises n-type impurities, so as to cover at least a central area of said front surface of said substrate;
   a second layer of semiconductor material doped with a doping of a second type of electrically opposite sign to said first type and arranged to a first depth in said substrate, wherein the second type comprises p-type impurities, said second layer of semiconductor material being parallel to said first layer of semiconductor material so as to create, between said first layer of semiconductor material and said second layer of semiconductor material, with a polarization of said diode radiation sensor, a high electric field region;

a third layer of said semiconductor material doped with a doping of said second type and arranged at a second depth in said substrate greater than said first depth, said third layer of semiconductor material being, is at least partially lateral to said second layer of semiconductor material; and a first isolation region interposed between a lateral edge of said charge multiplication diode and said first and said second layer of semiconductor material, said first isolation region extending into said substrate from said front surface to said third layer of semiconductor material so as to create, between said lateral edge of said charge multiplication diode and said first isolation region in a first direction, and between said front surface and said third layer of semiconductor material, in a second direction orthogonal to said first direction, a working area electrically separated from said first and second layer of semiconductor material.

2. The diode radiation sensor according to claim 1, further comprising a second isolation region arranged peripherally to said substrate.

3. The diode radiation sensor according to claim 2, wherein said second isolation region reaches a third depth in said substrate greater than said second depth at which said third layer of semiconductor material is present.

4. The diode radiation sensor according to claim 3, wherein said second isolation region reaches said rear surface of said substrate.

5. The diode radiation sensor according to claim 3, further comprising a sixth layer of the semiconductor material doped with a doping of said second type arranged into said substrate starting from said third layer of semiconductor material and interposed between said substrate and said second isolation region.

6. The diode radiation sensor according to claim 1, further comprising at least one optical isolating element arranged inside said working area.

7. The diode radiation sensor according to claim 1, further comprising one or more electronic circuits arranged inside said working area.

8. The diode radiation sensor according to claim 1, further comprising a fourth layer of semiconductor material doped with a doping of said first type and arranged at least adjacently to said front surface of said substrate above said first layer of semiconductor material, said doping of said fourth layer of semiconductor material being greater than said doping of said first layer so as to obtain a conductivity of said fourth layer of semiconductor material greater than a conductivity of said first layer of semiconductor material.

9. The diode radiation sensor according to claim 1, further comprising an additional layer doped with doping of the second type, said additional layer being arranged on said rear surface of said substrate.

* * * * *